US006596616B1

(12) United States Patent
Holm et al.

(10) Patent No.: US 6,596,616 B1
(45) Date of Patent: Jul. 22, 2003

(54) METHOD FOR FORMING SERRATED CONTACT OPENING IN THE SEMICONDUCTOR DEVICE

(75) Inventors: Paige M. Holm, Phoenix, AZ (US); Olin L. Hartin, Phoenix, AZ (US); H. Philip Li, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/126,795

(22) Filed: Apr. 19, 2002

(51) Int. Cl.[7] ................................. H01L 21/44

(52) U.S. Cl. ...................... 438/597; 438/640; 438/673; 438/701

(58) Field of Search ................... 438/586, 597, 438/629, 637–640, 668, 672–673, 687–688, 701

(56) References Cited

U.S. PATENT DOCUMENTS 5,994,173 A * 11/1999 Oki et al. .................... 438/161
6,104,042 A *  8/2000 Sah ............................. 257/59

* cited by examiner

Primary Examiner—Carl Whitehead, Jr.
Assistant Examiner—Thanh Nguyen
(74) Attorney, Agent, or Firm—Robert A. Rodriguez

(57) ABSTRACT

A method and apparatus for decreasing contact resistance between a ohmic contact (120) and a semiconductor material (106) are disclosed. Increased contact resistance, which occurs as a result of encroachment of the ohmic contact (120) into the semiconductor material (106) is compensated for by notching edges of the ohmic contact (1210) to increase the effective surface area between abutting surfaces of the ohmic contact (120) and semiconductor material (106). The increase in surface area increases the effective transfer length of the contact, which correspondingly reduces contact resistance and improves device performance.

11 Claims, 5 Drawing Sheets

METHOD FOR FORMING SERRATED CONTACT OPENING IN THE SEMICONDUCTOR DEVICE

FIELD OF THE INVENTION

The present invention relates generally to semiconductor manufacturing and more particularly to a method for forming a contact to a semiconductor region of a semiconductor device.

BACKGROUND OF THE INVENTION

In one respect, gallium arsenide semiconductor devices are considered advantageous over silicon semiconductor devices because they are capable of operating at higher speeds. This is due to the fact that electrons have a higher mobility in gallium arsenide than in silicon. However, the speed advantage is not necessarily obtainable unless electrical signals can efficiently be transmitted to and from the semiconductor device. One limitation that can impair transmission of the signals is a poor quality semiconductor device ohmic contact. This can be a significant consideration in gallium arsenide semiconductor manufacturing because the integration scheme required to form high quality electrical connections between ohmic contact materials and semiconductor materials, such as gallium arsenide can be more challenging than that of silicon. Therefore, unless high quality electrical connections can reliably be made, the speed advantages of gallium arsenide over silicon may not necessarily be achieved.

Shown in FIG. 1 is a cross section illustrating of a portion of a gallium arsenide metal semiconductor field effect transistor (MESFET) that includes undoped gallium arsenide semiconductor layers 16 and 20 and aluminum arsenide etch stop layers 18 and 22. Overlying the etch stop layer 22 on either side of the gate electrode 28 are n+ doped gallium arsenide capping layers 24 and overlying the capping layer 24 are metal ohmic contacts 26 (Note that portions of the semiconductor substrate 10 that include the channel region beneath the semiconductor layer 16 have been omitted for simplicity of illustration).

As stated previously, one potentially limiting aspect regarding the speed of a gallium arsenide semiconductor device is the quality of the electrical contact between the ohmic contact 26 and the semiconductor material of capping layer 24 (metal-semiconductor interface). Ideally the contact resistance ($R_c$) between the ohmic contact 26 and the capping layer 24 is as low as possible. Parameters that can influence contact resistance include the capping layer's sheet resistance ($\rho_s$), its thickness 32, and the transfer length ($L_t$) 30 of the contact. The transfer length, as understood by one of ordinary skill, is the length over which the voltage across the metal-semiconductor interface is has dropped to 1/e of its peak value at the edge of the contact. The transfer length is thus considered to be the effective electrical length of the ohmic contact and the measurement corresponds to the ohmic contact's ability to pass current through the metal-semiconductor interface. The transfer length is a function of the specific contact resistance $\rho_c$ and sheet resistance of the capping layer $\rho_s$. Accordingly, with knowledge of the contact technology, i.e. the specific contact resistance $\rho_c$ and the sheet resistance of the capping layer $\rho_s$, the transfer length $L_t$ can be determined by the equation: $L_t=[\rho_c/\rho_s]^{1/2}$. However, this relationship is not necessarily valid if the sheet resistance of the capping layer beneath the contact is not equal to the sheet resistance of the capping layer at its full thickness 32. This can be problematic because in reality the sheet resistance of the capping layer underneath the contact is higher that the full thickness capping layer because the ohmic contact encroaches some depth into the capping layer during contact formation. The encroachment correspondingly results in a thinning of the capping layer in these regions.

Shown in FIG. 2 is an illustration of an ohmic contact 27 encroaching (penetrating) into a capping layer 25. Initially after depositing the metal used to form the ohmic contact, the metal lies on the uppermost surface of the capping layer 25 (similar to the ohmic contact 26 and capping layer 24 shown in FIG. 1) such that the bottom surface of the metal is coplanar with the top surface of the capping layer. Then, the substrate is annealed for a predetermined period of time. The annealing process results in encroachment of the ohmic contact 27 into the capping layer 25 to a depth 35. The encroachment reduces the thickness 33 of the capping layer 25 in regions beneath the ohmic contact 27 and effectively increases its sheet resistance. This has the effective of reducing the ohmic contact transfer length (as compared to the transfer length 30 shown in FIG. 1) to produce a reduced effective transfer length 31. The reduction in transfer length correspondingly results in increased contact resistance of the ohmic contact 27, which potentially results in a slower semiconductor device.

One proposed solution to the contact encroachment problem includes increasing the overall of capping layer thickness; thereby making the conductivity change caused by the encroachment small relative to the conductivity of the overall capping layer. To accomplish this, the capping layer 25 should be made significantly thicker than the encroachment depth. Thus, given an encroachment depth of approximately 600 to 700 angstroms and a requirement that the capping layer thickness be approximately 10 times thicker than the encroachment depth, the capping layer should have a thickness of approximately 0.6 to 0.7 microns. Unfortunately at this thickness such an approach is unattractive due to the additional processing costs, the impact to cycle time and subsequent processing integration concerns, such as etching the increased capping layer thickness. Accordingly, alternative solutions for the encroaching problem are desirable.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A method and apparatus for decreasing contact resistance between a contact and a semiconductor material in the fabrication of a semiconductor device are disclosed. In one embodiment, the contact is an ohmic contact, the semiconductor material is a compound semiconductor material such as gallium arsenide, indium phosphide, or the like, and the semiconductor device is a metal semiconductor metal semiconductor field effect transistor (MESFET). In one specific embodiment, increased contact resistance, which occurs as a result of encroachment (penetration) of the ohmic contact into the semiconductor material is compensated for by serrating (notching) the edges of the ohmic contact to increase the effective surface area between abutting surfaces of the ohmic contact and the semiconductor material. The increase in surface area directly reduces contact resistance and increases device performance. An embodiment of the present invention will now be described more fully with references to the accompanying figures.

Figure 3:
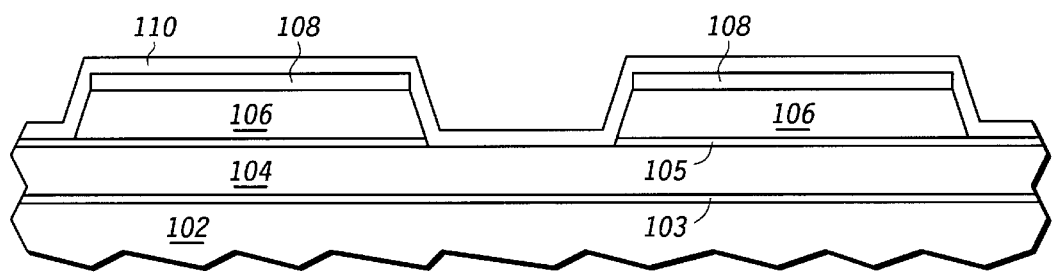
FIGS. 3–11 include illustrations of cross-sectional views showing the formation of a MESFT semiconductor device in accordance with an embodiment of the present invention.

Shown in FIG. 3 is a cross-sectional view of a partially fabricated gallium arsenide semiconductor device overlying a semiconductor substrate 102. In accordance with one embodiment, substrate 102 includes a gallium arsenide semiconductor substrate. Alternatively, the semiconductor substrate can include other monocrystalline materials, such as indium phosphide, gallium nitride, silicon, silicon-on-insulator, and the like. While not illustrated or described, one of ordinary skill understands that at this processing point, there may be one or more layers, doped regions, channel regions, well regions, active regions, and the like formed on or defined within the semiconductor substrate 102. While embodiments are described with reference to MESFET devices, one of ordinary skill appreciates that the embodiments are extendable to other semiconductor devices, such as metal oxide semiconductor field effect transistor (MOSFET) devices and the like.

Overlying the substrate 102 is a lower etch stop layer 103, a semiconductor layer 104, an upper etch stop layer 105, and capping layer 106. In one non-limiting embodiment, the lower etch stop layer 103 includes a layer of aluminum arsenide; the semiconductor layer 104 includes a layer of undoped gallium arsenide; the upper etch stop layer 105 includes a layer of aluminum arsenide; and the capping layer 106 is a layer of n+ doped gallium arsenide having thickness in a range of approximately 750–1250 Angstroms. The capping layer corresponds functionally to a portion of the semiconductor device that connects to a subsequently formed ohmic contact. Accordingly, one of ordinary skill recognizes that other semiconductor materials may be used to form the capping layer such as for example, indium phosphide, gallium nitride, silicon and the like and the capping layer may similarly undoped or p+ doped depending on the specific implementation.

In one embodiment the combination of the layers 102, 103, 104, 105, and 106 (as well as any underlying semiconductor layers, buffer layers, channel layers, etc.) are all deposited in a single molecular beam epitaxial (MBE) reactor during a single deposition sequence. In alternative embodiments the layers can be individually deposited or using any combination deposition processing sequences.

After depositing the capping film (remaining portions of the capping film are shown as capping layer 106) a hardmask layer is deposited over the surface of the semiconductor substrate. In one embodiment the hardmask layer is a layer of chemical vapor deposition (CVD) nitride. The hardmask layer is patterned and etched using a conventional plasma or wet dielectric etch process to define the patterned hardmask structures 108 shown in FIG. 3. Then the patterning layer is removed and the hardmask structures 108 are used to define mesa structures (capping layer 106) from remaining portions of the capping film, as shown in FIG. 3. The mesa structures can be formed using a plasma or wet etch chemistry that is selective to the underlying upper etch stop layer 105.

After defining the mesa structures, the exposed portions of the upper etch stop layer 105 are then removed using a buffered oxide etch process. Next, dielectric layer 110 is deposited over the uppermost surface of the semiconductor substrate as shown in FIG. 3.

Figure 4:
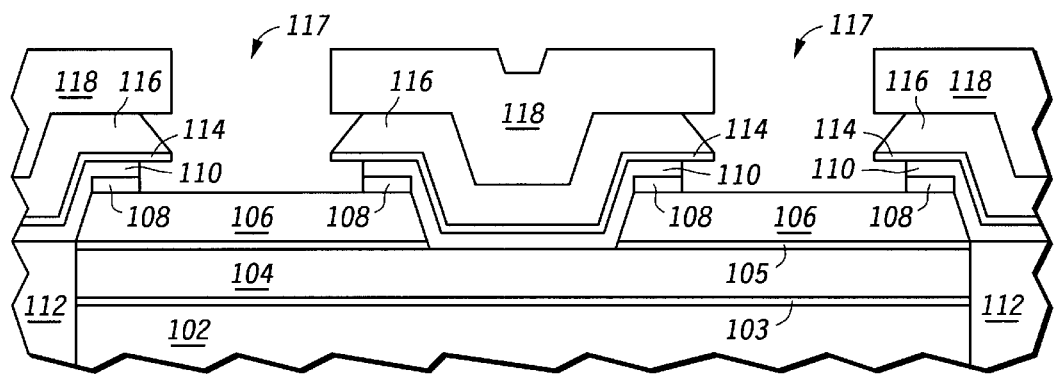

Turning now to FIG. 4, the semiconductor substrate shown in FIG. 3 has been patterned and implanted with oxygen to define the isolation regions 112. Then an etch stop layer 114, comprising for example, a layer of physical vapor deposition (PVD) aluminum nitride is deposited over the semiconductor substrate surface. Overlying the etch stop layer 114 is dielectric layer 116. In accordance with one embodiment the dielectric layer 116 is a CVD silicon dioxide oxide layer deposited using tetraethoxysilane (TEOS) as a source gas. Then, as shown in FIG. 4, a photo resist layer 118 is patterned over the dielectric layer 116, and the dielectric layer 116, aluminum nitride layer 114, dielectric layer 110 and hardmask layer 108 are all etched to define contact openings 117. In accordance with one embodiment, the dielectric layer 116 is wet etched using a conventional oxide etch process to expose the etch stop layer 114. Then the etch stop layer 114, the dielectric layer 110 and the hardmask layer 108 can be plasma etched using conventional plasma nitride etch processing to expose portions of the capping layer 106, as shown in FIG. 4.

Figure 5:
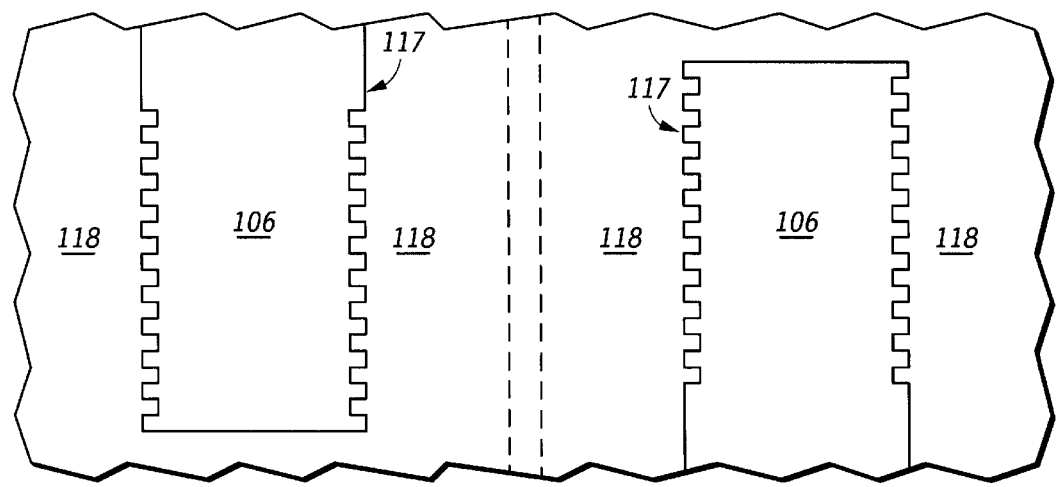
Figure 6:
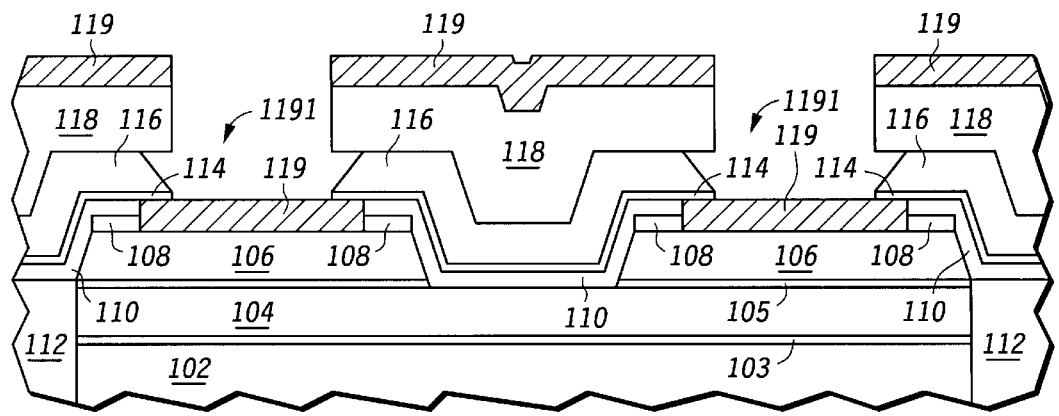

Shown in FIG. 5 is a top down view illustrating one embodiment of the shape of the resist pattern used to define contact opening 117. In accordance with one specific embodiment of the present invention, the patterns defining the contact openings 117 include notches (serrations) that extend along edge regions of the resist opening. The notches can advantageously be used to improve device performance as will be become apparent during subsequent discussion. Turning now to FIG. 6, a cross sectional view of the semiconductor substrate of FIG. 4 is shown after depositing conductive layer 119 over the semiconductor substrate. As shown in FIG. 6, the conductive layer 119 overlies both the photoresist layer 118 and portions of the capping layer 106 exposed by contact opening 117. Those portions of the conductive layer 119 formed within the contact opening 117 correspond to ohmic contact regions for the semiconductor device.

Figure 1:
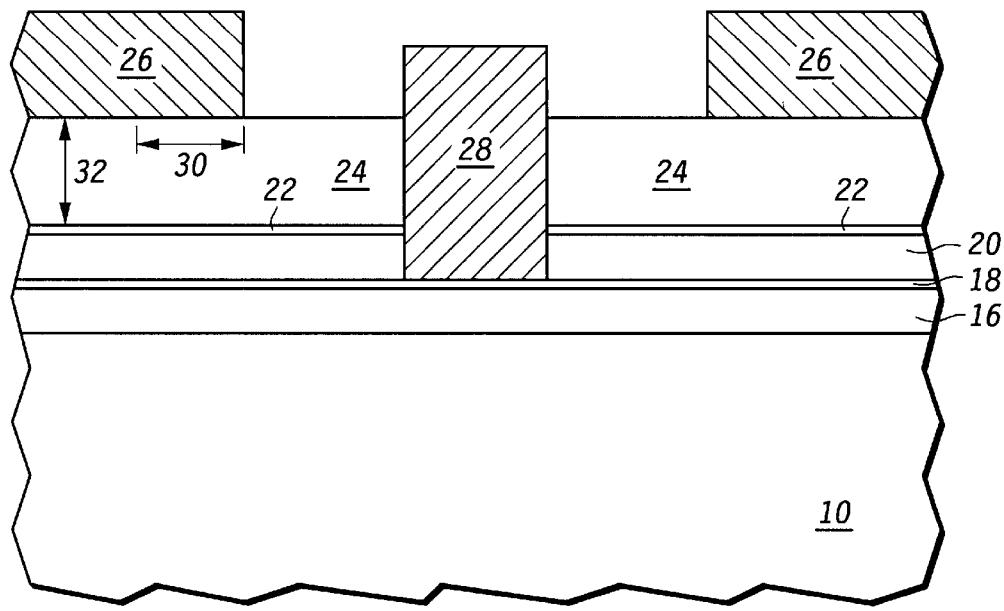
FIG. 1 includes an illustration of a cross-sectional view of a semiconductor device having ohmic contacts overlying a capping layer associated with source and drain regions of the semiconductor device.
Figure 2:
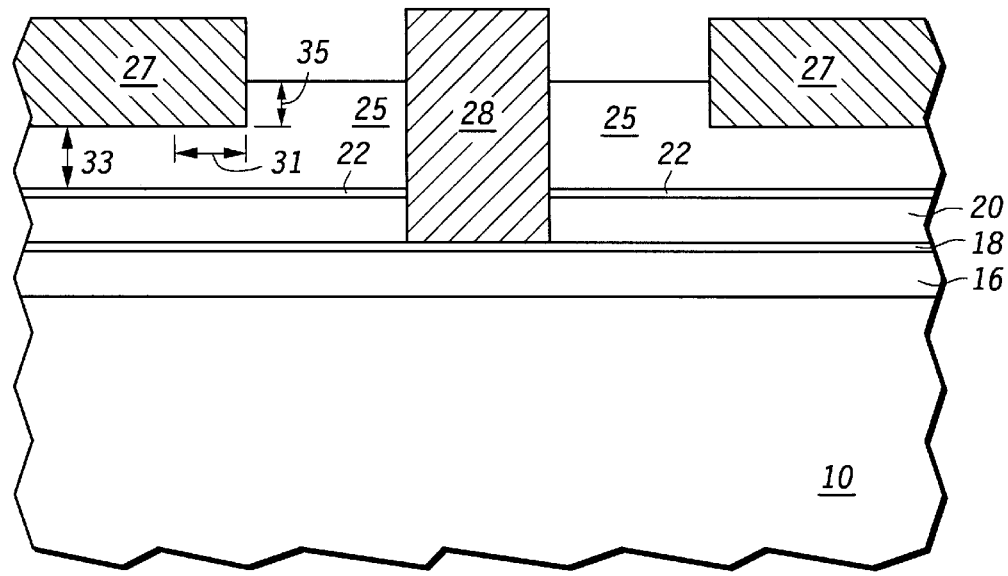
FIG. 2 includes a cross-sectional view of the semiconductor device of FIG. 1, further illustrating portions of the ohmic contact penetrating into the capping layer.
Figure 7:
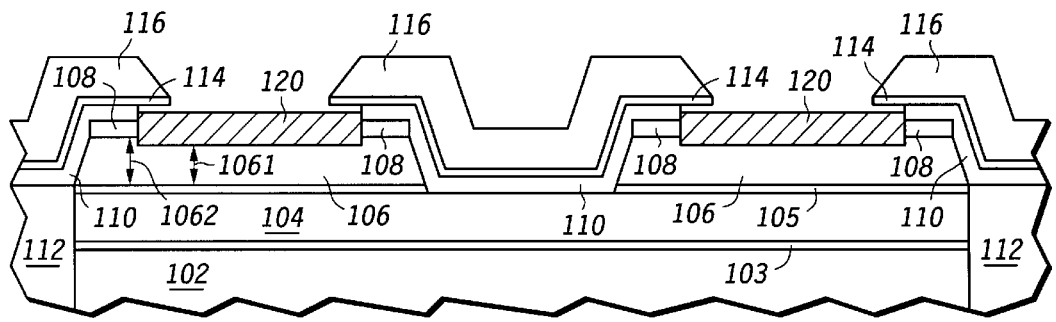

In one embodiment, the conductive layer 119 is a composite layer of individual films that include, from bottom to top, 1–300 Angstroms nickel; 1–300 Angstroms germanium; and 1500–2500 Angstroms gold, which have been deposited using physical vapor deposition. The total thickness of the conductive layer 19 is in a range of approximately 2000–3000 angstroms. After the conductive layer 119 is deposited, the resist layer 118 is removed including those portions of the conductive layer 119 overlying the photoresist using a conventional solvent based, dielectric assisted lift off process to substantially define the ohmic contact regions 1191. The semiconductor substrate is then annealed to substantially form the ohmic contacts 120 as shown in FIG. 7. In one embodiment the semiconductor substrate is annealed in a rapid thermal annealing process at a temperature and a range of 400–500 degrees for approximately 0.5 to 1.5 minutes. In an alternative embodiment, other annealing processes, such as furnace anneals, and the like may be used. As discussed previously with respect to FIG. 2, as result of the annealing process, the ohmic contacts 120 which form the electrical connections to the semiconductor device source and drain regions have encroached (penetrated) into the capping layer such that the thickness of the capping layer below the ohmic contact 1061 is less than the full thickness of the capping layer 1062 (i.e., those regions that do not underlie the ohmic contacts 120). However unlike the prior art ohmic contacts where the encroachment produces elevated contact resistance as compared contacts which do not have encroachment, the present inventors have discovered that a reduction in contact resistance can be achieved by increasing the peripheral surface area of the contact by notching (serrating) the ohmic contact along edge regions of the ohmic contacts structure thereby mitigating the impact and effect of the encroachment on contact resistance.

The penetration of the contact into the cap layer increases the sheet resistance of the remaining conductive layer underneath the contact. This acts to reduce the transfer length of the contact as describe previously. The reduced transfer length reduces the effective area of the contact resulting in an inflated value of contact resistance. The serrations along the edge of the contact act to increase the effective area of the contact, not by altering the transfer length, but instead by increasing the perimeter of the contact. The increase in area is comprised of the sidewalls of the notches. Accordingly, the lower sheet resistance of the full-thickness cap layer within the notch allows these regions around the walls of the notch to be accessed by the flowing current.

Figure 8:
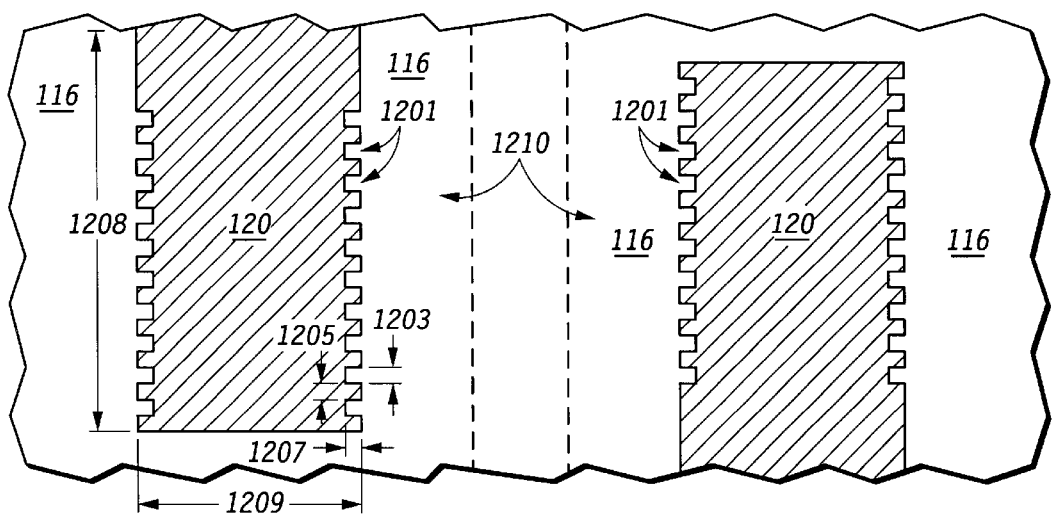

Shown in FIG. 8 is a top-down view illustrating one embodiment of the possible shape of ohmic contacts 120. As shown in FIG. 7, the shape of the ohmic contact corresponds to the patterned opening of the resist layer 118 shown in FIG. 5. As shown in FIG. 8, extending along the length 1208 of the ohmic contacts 120 are notches 1201, wherein a plurality of notches further define a serrated edge 1210 that extends at least along a portion of the length 1208 of the ohmic contact 120. As shown in FIG. 8, the notches have a width 1203 and a depth 1207, and a spacing 1205 separates individual notches. In one preferred embodiment, to maximize the effect of the notching, the spacing between notches can be on the order of twice the transfer length of the contact since this approximates the dimension (area) of the contact through which current flows. If the notches are closer than twice the effective transfer length, then the transfer lengths from adjacent notches overlap resulting in elevated contact resistance. If the notches are substantially more than two transfer lengths apart, then the beneficial effects of the serrations are not maximized.

The shape of the notch should take into consideration its aspect ratio. The aspect ratio is defined as the depth (or shallowness) of the notch into the metal (FIG. 8 dimension 1207 and FIG. 11 dimensions 1116, 1118), divided by the width of the notch (FIG. 8 dimension 1203 and FIG. 11 dimensions 1115, 1117). The optimal aspect ratio of the notch itself depends largely on the difference between the sheet resistance under the contact and the original cap layer sheet resistance. If the difference in these two values is small, the optimum notch will tend to be wide and shallow (low aspect ratio), whereas if the difference in sheet resistances is large, the optimum notch geometry will tend to be narrow and deep (high aspect ratio).

Figure 11:
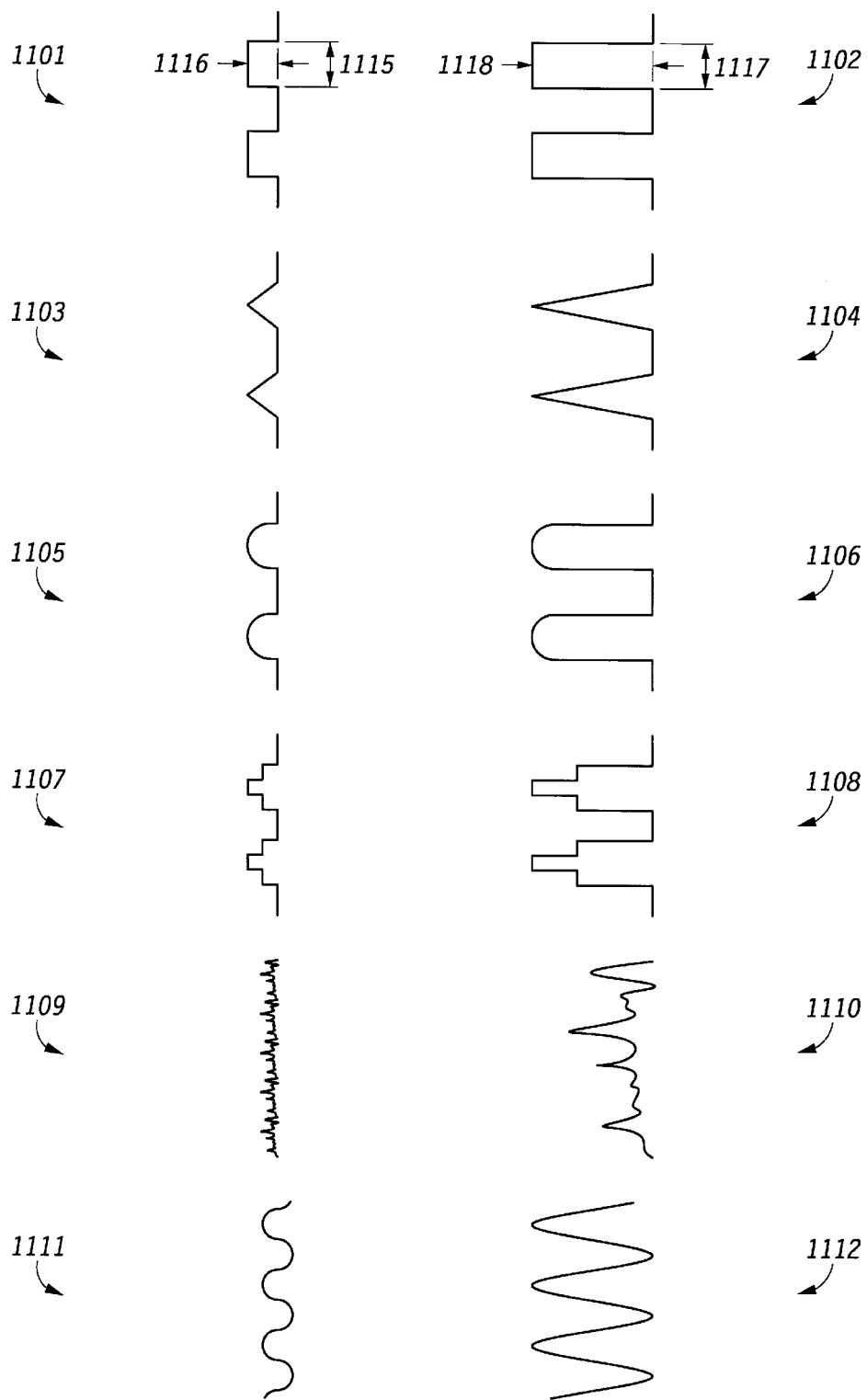

In addition, as illustrated in FIG. 11, the notches can have shapes other than rectangular 1101 and 1102 (as disclosed previously). Other possible shapes can include (but are not limited to) triangular 1103 and 1104, curvilinear (rounded) 1105 and 1106 and all combinations of the above, as well as step-wise combinations 1107 and 1108, irregular shapes 1109 and 1110 and sinusoidal 1111 and 1112. Additionally, relative examples of low aspect ratio features and high aspect ratio features are indicated by shapes 1101, 1103, 1105, 1107, 1109, 1111 and 1102, 1104, 1106, 1108, 1110, and 1112, respectively. As indicated in the shapes 1101 and 1102, a relatively low aspect ratio feature may be considered one where the depth 1116 is less than the width 1115 as compared to a high aspect ratio feature where the depth 1118 is greater than the width 1117.

Typical notch spacing is in the range of 1 to 10 um, while typical notch depth and widths may be in the range of 0.5 to 5 um. As an example of typical values for notch dimensions, assuming an ohmic contact resistivity of $10^{-6}$ ohm-cm$^2$ and a 1000 A thick cap layer with sheet resistance (non-encroached) of 60 ohm/square giving a non-encroached transfer length of about 1.2 um. If the ohmic contact penetrates to a depth of three-fourths of the cap layer thickness such that sheet resistance under the contact is increased to 240 ohm/square, then the effective transfer length is reduced to about 0.6 um, or half of the original value. In this case, a reasonable value for the notch spacing might be in the 1–2 um range and the notch width and depth each in the 0.5 to 1.5 um range. Thus under these conditions an aspect ratio of approximately 1:1 would be reasonable.

Although the present embodiment specifically discloses serrated edges that extend along edge portion(s) of the length of the contact, one of ordinary skill recognizes that in alternative embodiments, the serrations can occur in any configuration that increases the effective surface area between the ohmic contact and the capping layer. Accordingly, in alternative embodiments, the notches may extend along the width 1209, or alternatively as ridges formed within the capping layer that contact bottom-most surface of ohmic contact 120 (not shown). Essentially any ohmic contact/capping layer integration that increases the effective (electrically active) surface area between the ohmic contact 120 and the abutting capping (semiconductor) layer 106 can be used. And more particularly, any configuration that increases the effective surface area between the ohmic contact 120 and the abutting capping layer 106, wherein the ohmic contact penetrates some distance into the capping layer. Furthermore, while the individual notches have been described and illustrated basically as rectangular or square in shape and having a regular periodicity, one of ordinary skill in the art recognizes that this is merely illustrative of one embodiment, and that any variety of shapes, spacing, and notch distributions may be used to achieve the intended purpose of improving contact resistance and all fall within the scope and spirit of the present invention.

Figure 9:
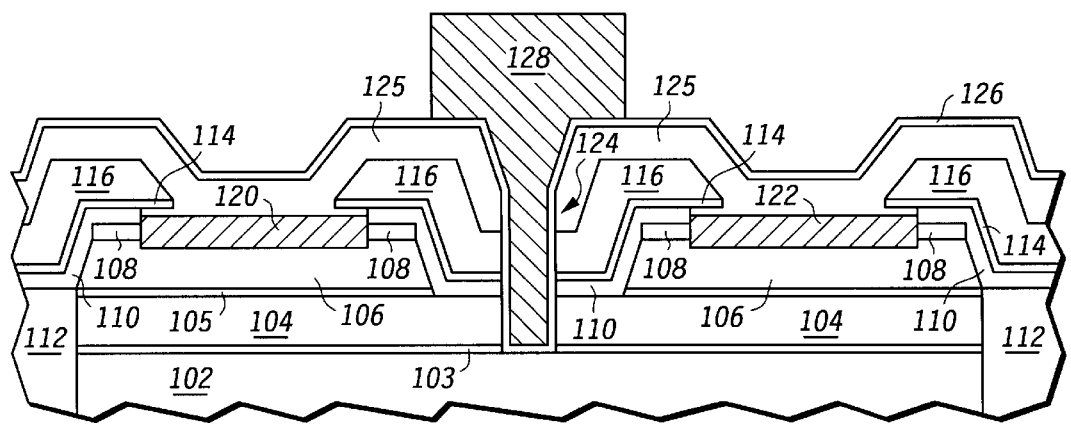

FIG. 9 illustrates a cross sectional view of the partially fabricated semiconductor device shown in FIG. 8 after partially forming a gate electrode 128. After forming the ohmic contacts 120, a dielectric layer 125 is deposited over the surface of the semiconductor substrate to cover and electrically insulate the exposed ohmic contacts 120. In one embodiment the dielectric layer 125 is a layer of CVD deposited TEOS. The semiconductor substrate is then patterned with resist to define a patterned opening corresponding to gate channel opening 124. The gate channel opening 124 is then defined using a combination of wet and dry etch processes. First, the portions of dielectric layer 125 and dielectric layer 116 exposed by the patterned openings are sequentially etched using a conventional dielectric plasma etch process. Next the resist is removed using a conventional ash/solvent cleaning process and exposed portions of the stop layer 114 are wet etched. Next, exposed portions of the dielectric layer 110 are removed using a conventional dielectric plasma etch process to expose the semiconductor layer 104. Finally exposed portions of the semiconductor layer 104 and remaining portions of layer 103 are removed using a series of wet etch processes to substantially define the gate channel opening 124.

Next, a gate metal barrier layer 126 deposited over the entire surface of the semiconductor substrate and a seed layer (not shown) is deposited over the gate metal barrier layer. In one embodiment the gate metal barrier layer 126 is a sputter deposited layer of titanium tungsten nitride and the seed layer is a composite layer from bottom to top of sputter deposited titanium and. gold. Then the semiconductor substrate is patterned with resist to define an opening that exposes the gate channel opening 124 and an electroplating process is used to deposit a conductive gate material, such as gold, copper, aluminum, a refractory metal, or the like within the gate channel opening 124. Then, the resist is removed to substantially define the gate structure 128 as shown in FIG. 9.

Figure 10:
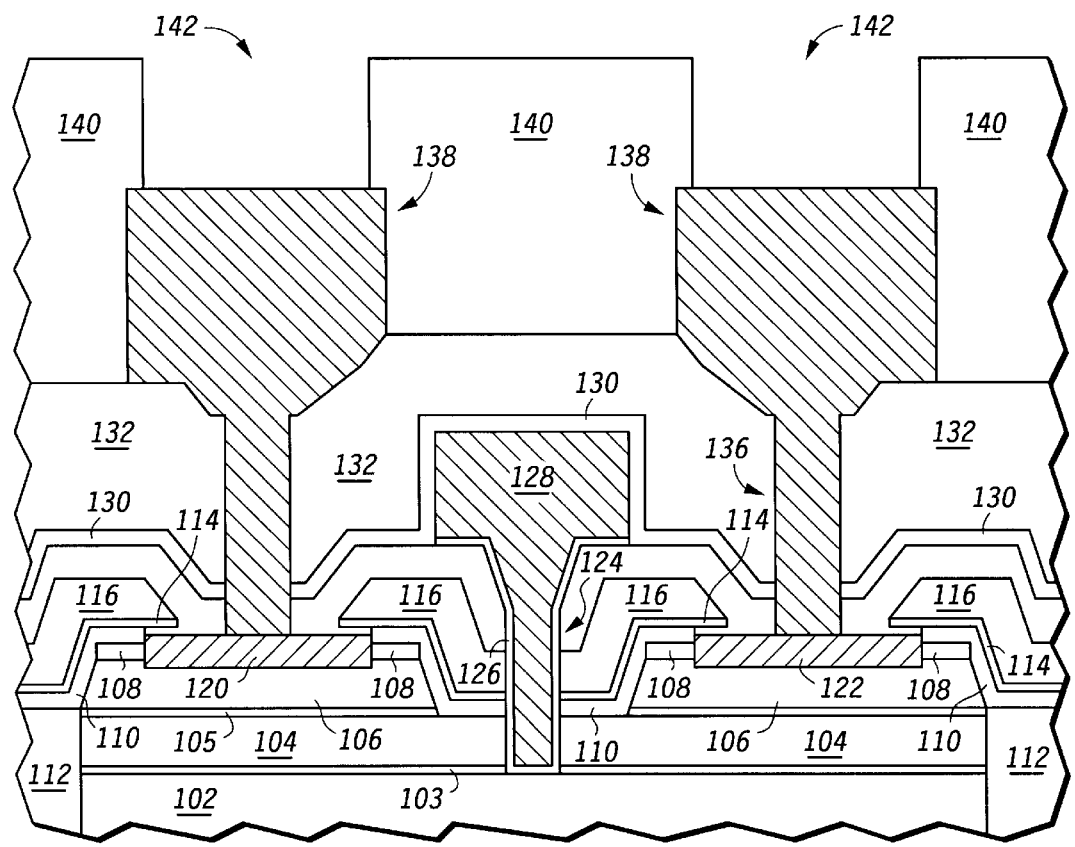

Turning now to FIG. 10, after forming the gate structure 128, the semiconductor substrate is etched using to remove exposed remaining portions of the titanium/gold seed layer and gate metal barrier layer 126 not covered by gate structure 128. Then, a stack of dielectric layers 130 and 132 are deposited over the semiconductor substrate surface. In one embodiment, the dielectric layer 130 is a layer of CVD silicon nitride and the dielectric layer 132 is a layer of CVD silicon dioxide. After depositing the dielectric layer 130 and 132 the semiconductor substrate is patterned and etched using conventional processing to define interconnect openings 136. The interconnects 138 can be formed by first depositing a seed layer, then patterning the substrate to define interconnect patterns corresponding to the interconnect openings 136, and then electroplating the interconnects onto exposed portions of the seed layer. The interconnects 138 typically comprise copper, gold, aluminum, or the like. After forming interconnects 138, the resist is removed, remaining exposed portions of the seed layer are removed and a passivation layer 140 is deposited over the semiconductor substrate and patterned and etched to define pad openings 142 thereby substantially forming the semiconductor device, as shown in FIG. 10.

The present invention takes advantage of a conductive semiconductor layer butting up against the edge of an ohmic contact to compensate for increased contact resistance resulting from penetration of the contact into the semiconductor layer. The design, in one embodiment includes introducing serrations along the edge of the contact to increase its periphery. The increase in periphery translates into increased effective area of the contact, which results in reduced contact resistance as compared to contacts having smooth or unserrated edges. The serrated contacts are formed using conventional patterning and etching processes and can be integrated into an existing process flows without a need to use exotic materials, develop new processes, or purchase new processing equipment. In addition while the previous method for forming the notched contact included using a lift-off process, one of ordinary skill recognizes that alternative methods may also be used. For example, after patterning and etching to form the notched contact opening in the dielectric layer, the resist can be removed prior to depositing the conductive material and then after depositing conductive material, the portions of the conductive material outside the contact opening can be removed using an etch back or chemical mechanical polishing process to define the notched contact.

Thus, it is apparent that there has been provided, in accordance with embodiments of the present invention, a process for forming an contact structure that provides advantages over the prior art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:

forming dielectric layer over a semiconductor device substrate;

forming a patterning layer over the dielectric layer;

forming an opening in the patterning layer, wherein opening includes a patterned notched edge that extends along at least a portion of the periphery of the opening;

forming a notched contact opening in the dielectric layer;

depositing a conductive material within the notched contact opening; and forming a notched contact structure abutting a portion of the semiconductor device.

2. The method of claim 1, wherein forming a notched contact structure is further characterized by removing the patterning layer after depositing the conductive material.

3. The method of claim 1, wherein forming a notched contact structure is further characterized by removing the patterning layer prior to depositing the conductive material.

4. The method of claim 1, wherein the notched contact structure is further characterized as an ohmic contact.

5. The method of claim 4, wherein the ohmic contact includes a material selected from a group consisting of nickel, germanium, and gold.

6. The method of claim 4, wherein the portion of the semiconductor device is further characterized as a semiconductor-capping layer.

7. The method of claim 6, wherein the semiconductor-capping layer is further characterized as a gallium arsenide capping layer.

8. The method of claim 7, wherein the gallium arsenide capping layer is further characterized as a doped gallium arsenide capping layer.

9. The method of claim 6, wherein a depth of encroachment of the ohmic contact into the semiconductor-capping layer is greater than approximately 250 Angstroms.

10. The method of claim 1, wherein notches in the notched edge region are separated by a spacing in a range of 1 to 10 microns.

11. The method of claim 10, wherein notches have a depth in a range of 0.5 to 5 microns and a width in a range of 0.5 to 5 microns.

\* \* \* \* \*